(12) United States Patent
Madsen

(10) Patent No.: US 9,290,843 B2
(45) Date of Patent: Mar. 22, 2016

(54) BALL SCREW SHOWERHEAD MODULE ADJUSTER ASSEMBLY FOR SHOWERHEAD MODULE OF SEMICONDUCTOR SUBSTRATE PROCESSING APPARATUS

(71) Applicant: Lam Research Corporation, Fremont, CA (US)

(72) Inventor: Eric Russell Madsen, Hillsboro, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 96 days.

(21) Appl. No.: 14/177,879

(22) Filed: Feb. 11, 2014

(65) Prior Publication Data

US 2015/0225854 A1 Aug. 13, 2015

(51) Int. Cl.

| C23C 16/455 | (2006.01) |
|---|---|
| H01L 21/306 | (2006.01) |
| C23C 16/44 | (2006.01) |
| B05D 1/00 | (2006.01) |
| H01L 21/768 | (2006.01) |
| H05K 3/14 | (2006.01) |

(52) U.S. Cl.
CPC ....... *C23C 16/45565* (2013.01); *C23C 16/4409* (2013.01); *C23C 16/455* (2013.01); *C23C 16/45563* (2013.01); *C23C 16/45587* (2013.01); *C23C 16/45589* (2013.01); *H01L 21/306* (2013.01); *B05D 1/60* (2013.01); *H01L 21/76843* (2013.01); *H01L 21/76876* (2013.01); *H05K 3/143* (2013.01); *H05K 3/146* (2013.01); *Y10T 29/49764* (2015.01); *Y10T 29/49963* (2015.01)

(58) Field of Classification Search
CPC ............ C23C 16/455; C23C 16/45563; C23C 16/45565; C23C 16/45587; C23C 16/45589; B05D 1/60; H01L 21/76843; H01L 21/76876; H05K 3/143; H05K 3/146
USPC ............ 118/715; 156/345.1; 427/96.8, 248.1, 427/255.23
See application file for complete search history.

(56) References Cited

U.S. PATENT DOCUMENTS

| 3,215,508 | A | * | 11/1965 | Piester | ................ | B01J 8/0278 34/584 |
|---|---|---|---|---|---|---|
| 5,778,969 | A | * | 7/1998 | Kyung | .............. | H01L 21/67103 118/725 |
| 5,908,508 | A | | 6/1999 | Vanell et al. | | |
| 6,453,992 | B1 | * | 9/2002 | Kim | ................ | C23C 16/45565 118/666 |
| 7,858,898 | B2 | | 12/2010 | Bailey, III et al. | | |
| 8,033,001 | B2 | | 10/2011 | Bockemehl, Jr. et al. | | |
| 8,075,690 | B2 | * | 12/2011 | Keller | .............. | C23C 16/45565 118/715 |

(Continued)

*Primary Examiner* — Rudy Zervigon
(74) *Attorney, Agent, or Firm* — Buchanan, Ingersoll & Rooney PC

(57) ABSTRACT

A semiconductor substrate processing apparatus comprises a ball screw showerhead module adjuster assembly for adjusting the planarization of a showerhead module of the apparatus. The ball screw showerhead module adjuster assembly comprises a collar supported in a stepped opening of a top plate; a bellows forms an airtight seal between the collar and an adjuster plate supported above the collar by at least three adjustable ball screws operable to adjust the planarization of the adjuster plate with respect to the collar. An insulating sleeve extends through an opening in the collar, the bellows, and the adjuster plate. A stem of the showerhead module is supported in an opening of the insulating sleeve by a nut assembly such that the stem is supported and aligned within the insulating sleeve so that an adjustment of planarization of the adjuster plate thereby adjusts the planarization of the faceplate of the showerhead module.

20 Claims, 6 Drawing Sheets

(56) References Cited

U.S. PATENT DOCUMENTS

| | | | |
|---|---|---|---|
| 8,137,467 B2* | 3/2012 | Meinhold | C23C 16/45565 118/663 |
| 8,216,380 B2 | 7/2012 | White et al. | |
| 8,382,939 B2 | 2/2013 | Kutney et al. | |
| 8,431,033 B2 | 4/2013 | Zhou et al. | |
| 8,557,712 B1 | 10/2013 | Antonelli et al. | |
| 8,580,697 B1 | 11/2013 | Lang et al. | |
| 8,673,080 B2* | 3/2014 | Meinhold | C23C 16/45565 118/663 |
| 9,121,097 B2* | 9/2015 | Mohn | H01J 37/3244 |
| 2005/0208774 A1* | 9/2005 | Fukunaga | C23C 18/1619 438/745 |
| 2006/0060138 A1* | 3/2006 | Keller | H01J 37/3244 118/715 |
| 2009/0095219 A1* | 4/2009 | Meinhold | C23C 16/45565 118/708 |
| 2009/0095220 A1* | 4/2009 | Meinhold | C23C 16/45565 118/712 |
| 2009/0260571 A1* | 10/2009 | Ostrowski | C23C 16/45565 118/728 |
| 2013/0005140 A1 | 1/2013 | Jeng et al. | |
| 2013/0230987 A1 | 9/2013 | Draeger et al. | |
| 2013/0269609 A1 | 10/2013 | Leeser | |
| 2013/0319329 A1 | 12/2013 | Li et al. | |
| 2013/0323860 A1 | 12/2013 | Antolik et al. | |
| 2015/0225854 A1* | 8/2015 | Madsen | C23C 16/45565 438/697 |

* cited by examiner

US 9,290,843 B2

BALL SCREW SHOWERHEAD MODULE ADJUSTER ASSEMBLY FOR SHOWERHEAD MODULE OF SEMICONDUCTOR SUBSTRATE PROCESSING APPARATUS

FIELD OF THE INVENTION

This invention pertains to semiconductor substrate processing apparatuses used for processing semiconductor substrates, and may find particular use in performing chemical vapor depositions of thin films.

BACKGROUND

Semiconductor substrate processing apparatuses are used to process semiconductor substrates by techniques including, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, etching, and resist removal. One type of semiconductor substrate processing apparatus used to process semiconductor substrates includes a reaction chamber containing a showerhead module and a substrate pedestal module which supports the semiconductor substrate in the reaction chamber. The showerhead module delivers process gas into the reactor chamber so that the semiconductor substrate may be processed. In such chambers installation and removal of the showerhead module can be time consuming, and further nonuniform film deposition during substrate processing can occur if a lower surface of the showerhead module is not parallel to an upper surface of the substrate pedestal module.

SUMMARY

Disclosed herein is a semiconductor substrate processing apparatus for processing semiconductor substrates. The substrate processing apparatus comprises a chemical isolation chamber in which individual semiconductor substrates are processed wherein a top plate forms an upper wall of the chemical isolation chamber, a process gas source in fluid communication with the chemical isolation chamber for supplying a process gas into the chemical isolation chamber; a showerhead module which delivers the process gas from the process gas source to a processing zone of the processing apparatus wherein the individual semiconductor substrates are processed wherein the showerhead module comprises a base attached to a lower end of a stem wherein a faceplate having gas passages therethrough forms a lower surface of the base, and a substrate pedestal module which is configured to support the semiconductor substrate in the processing zone below the faceplate during processing of the substrate. A ball screw showerhead module adjuster assembly supports the showerhead module in the top plate wherein the ball screw showerhead module adjuster assembly is operable to adjust the planarization of the faceplate of the showerhead module with respect to an upper surface of the substrate pedestal module adjacent the faceplate. The ball screw showerhead module adjuster assembly comprises a collar supported in a stepped opening of the top plate wherein an O-ring forms an airtight seal between a lower surface of the collar and a horizontal upper surface of the stepped opening, a bellows which forms an airtight seal between the collar and an adjuster plate supported above the collar by at least three adjustable ball screws wherein the at least three adjustable ball screws are operable to adjust the planarization of the adjuster plate with respect to the collar, and an insulating sleeve which extends through an opening in the collar, the bellows, and the adjuster plate, wherein a flange on an upper end of the insulating sleeve is fixedly supported on an upper surface of the adjuster plate and an O-ring forms an airtight seal therebetween. The stem of the showerhead module is supported in a stepped opening of the insulating sleeve by a nut assembly. The nut assembly is operable to compress a tapered/conical shoulder of the stem below the nut assembly against a conical shoulder of the insulating sleeve such that the stem of the showerhead module is fixedly supported and aligned within the insulating sleeve so that an adjustment of planarization of the adjuster plate thereby adjusts the planarization of the faceplate of the showerhead module.

Also disclosed herein is a ball screw showerhead module adjuster assembly which is configured to support a showerhead module in a top plate of a semiconductor substrate processing apparatus used for processing semiconductor substrates. The ball screw showerhead module adjuster assembly is operable to adjust the planarization of a faceplate of the showerhead module with respect to an upper surface of a substrate pedestal module configured to be adjacent the faceplate. The ball screw showerhead module adjuster assembly comprises a collar configured to be supported in a stepped opening of the top plate wherein an O-ring is configured to form an airtight seal between a lower surface of the collar and a horizontal upper surface of the stepped opening, a bellows which forms an airtight seal between the collar and an adjuster plate supported above the collar by at least three adjustable ball screws wherein the at least three adjustable ball screws are operable to adjust the planarization of the adjuster plate with respect to the collar, and an insulating sleeve which extends through an opening in the collar, the bellows, and the adjuster plate, wherein a flange on an upper end of the insulating sleeve is fixedly supported on an upper surface of the adjuster plate and an O-ring forms an airtight seal therebetween. A stem of the showerhead module is configured to be supported in a stepped opening of the insulating sleeve by a nut assembly which is configured to compress a tapered/conical shoulder of the stem below the nut assembly against a conical shoulder of the insulating sleeve such that the stem of the showerhead module is fixedly supported and aligned within the insulating sleeve so that an adjustment of planarization of the adjuster plate thereby adjusts the planarization of the faceplate of the showerhead module.

BRIEF DESCRIPTION OF THE DRAWING FIGURES

DETAILED DESCRIPTION

Figure 1:
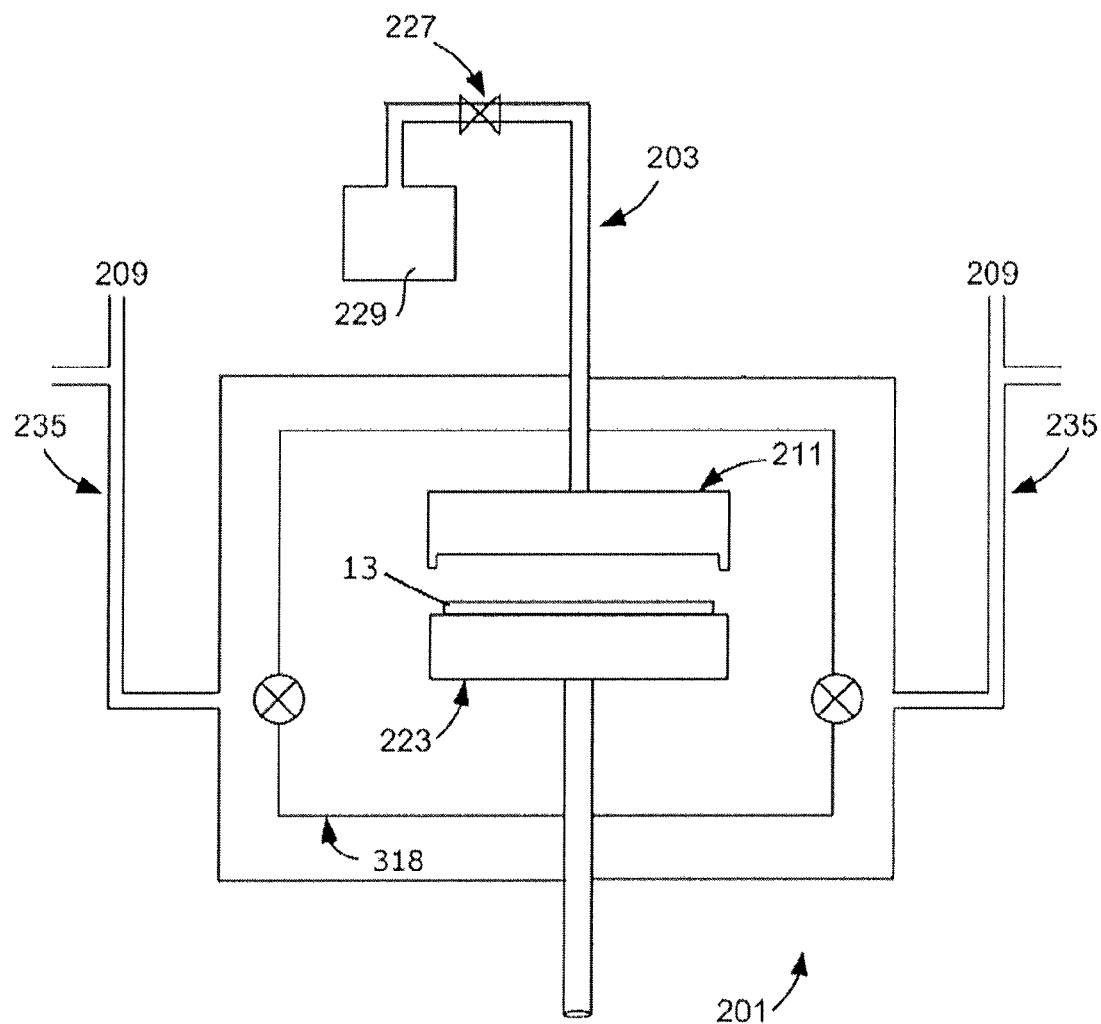
FIG. 1 illustrates a schematic diagram showing an overview of a chemical deposition apparatus in accordance with embodiments disclosed herein.

In the following detailed description, numerous specific embodiments are set forth in order to provide a thorough understanding of the apparatus and methods disclosed herein. However, as will be apparent to those skilled in the art, the present embodiments may be practiced without these specific details or by using alternate elements or processes. In other instances, well-known processes, procedures, and/or components have not been described in detail so as not to unnecessarily obscure aspects of embodiments disclosed herein. As used herein in connection with numerical values the term "about" refers to ±10%.

As indicated, present embodiments provide semiconductor substrate processing apparatuses such as deposition apparatuses (or in an alternate embodiment an etching apparatus) and associated methods for conducting a chemical vapor deposition such as a plasma enhanced chemical vapor deposition. The apparatus and methods are particularly applicable for use in conjunction with semiconductor fabrication based dielectric deposition processes or metal deposition processes which require separation of self-limiting deposition steps in a multi-step deposition process (e.g., atomic layer deposition (ALD), plasma enhanced atomic layer deposition (PEALD), plasma enhanced chemical vapor deposition (PECVD), pulsed deposition layer (PDL), molecular layer deposition (MLD), or plasma enhanced pulsed deposition layer (PEPDL) processing), however they are not so limited. Exemplary embodiments of methods of processing a semiconductor substrate can be found in commonly-assigned U.S. Patent Application Nos. 2013/0230987, 2013/0005140, 2013/0319329, and U.S. Pat. Nos. 8,580,697, 8,431,033, and 8,557,712, which are hereby incorporated by reference in their entirety.

The aforementioned processes can suffer from some drawbacks associated with nonuniform process gas delivery to an upper surface of a wafer or semiconductor substrate receiving deposited process gas such as a process gas precursor or reactant. For example, a nonuniform precursor distribution on the upper surface of the semiconductor substrate can form if a lower surface of a showerhead module which delivers process gas to the semiconductor substrate is not parallel to an upper surface of a substrate pedestal module which supports the semiconductor substrate. Further, operations to install, remove, and planarize the showerhead module with respect to the substrate pedestal module can be time consuming, and can increase downtime of the semiconductor substrate processing apparatus.

There are generally two main types of CVD showerhead modules: the chandelier type and the flush mount type. The chandelier showerhead modules have a stem attached to a top plate of the reaction chamber on one end and a faceplate on the other end, resembling a chandelier. A part of the stem may protrude the top plate to enable connection of gas lines and RF power. Flush mount showerhead modules are integrated into the top of a chamber and do not have a stem. Present embodiments disclosed herein pertain to a chandelier type showerhead module.

Showerhead module leveling (planarization) is typically performed with a wet clean procedure that involves cooling and venting a reaction chamber (chemical isolation chamber) of the apparatus one or multiple times. The cooling and venting may be required to access the interior of the chamber to adjust the spacing between the showerhead and the substrate pedestal module as well as the planarization of a lower surface of the showerhead with respect to an upper surface of the pedestal module. A conventional technique involves placing metallic foil balls in the chamber to measure the gap between the showerhead module and the substrate pedestal module and then adjusting a number of standoffs, usually three or more, between a backing plate of the showerhead module and the top plate of the reaction chamber based on the measurements. The standoffs can only be adjusted by opening the top plate after venting and cooling the chamber. Multiple measuring and adjusting cycles may be performed before the showerhead module is considered level. Because the showerhead cannot be leveled through external manipulation, the process can be very time-consuming, up to about 20 hours.

Present embodiments disclosed herein address these issues. Accordingly, a showerhead module which includes a ball screw showerhead module adjuster assembly is designed to be leveled from outside of the reaction chamber, even while the chamber is under vacuum (does not require venting). The showerhead module and ball screw showerhead module adjuster assembly design can also reduce or eliminate parts that retain induced stresses that can subsequently tilt a leveled showerhead. Thus, not only the leveling time is shorter, the duration between leveling may also be longer. In some cases, the chamber uptime is increased by reducing the duration and frequency of scheduled downtimes. In a preferred embodiment, the showerhead module is installed and supported by the top plate of the reaction chamber by a nut assembly which includes a single nut, thus reducing the time required to install and remove the showerhead module from the semiconductor substrate processing apparatus.

FIG. 1 is a schematic diagram showing an overview of a semiconductor substrate processing apparatus 201 for chemical vapor deposition in accordance with embodiments disclosed herein. A semiconductor substrate 13 such as a wafer sits on top of a movable pedestal module 223 that can be raised or lowered relative to a showerhead module 211, which may also be moved vertically. Reactant material gases are introduced into a processing zone 318 of the chamber via gas line 203 wherein the process gas flow is controlled by a mass flow controller 229. Note that the apparatus may be modified to have one or more gas lines, depending on the number of reactant gases used. The chamber is evacuated through vacuum lines 235 that are connected to a vacuum source 209. The vacuum source may be a vacuum pump.

Figure 2:
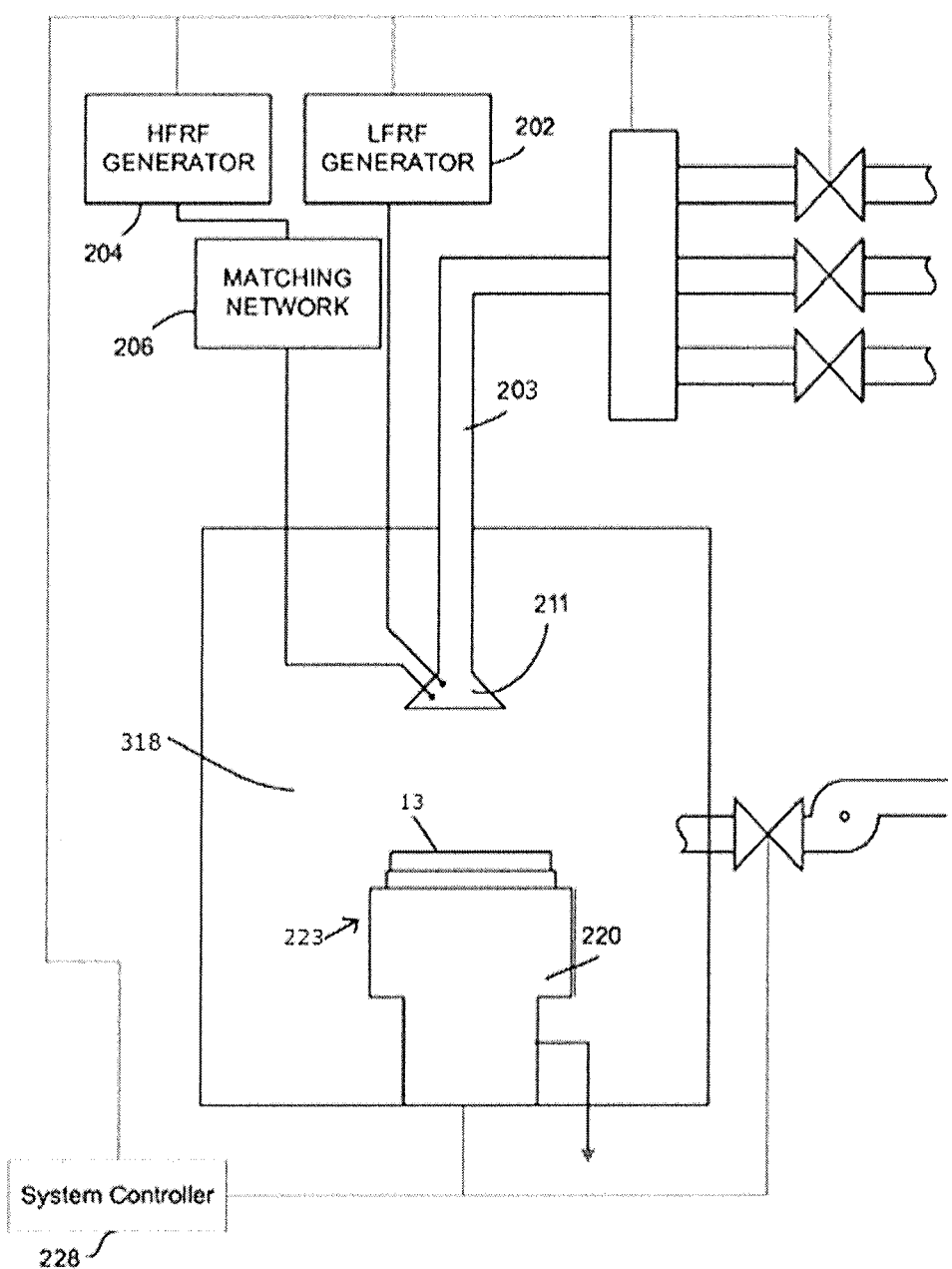
FIG. 2 illustrates a block diagram depicting various apparatus components arranged for implementing embodiments disclosed herein wherein plasma can be utilized to enhance deposition and/or surface reactions between reacting species during the generation of thin films.

Embodiments disclosed herein can be implemented in a plasma enhanced chemical deposition apparatus (i.e. PECVD apparatus, PEALD apparatus, or PEPDL apparatus). FIG. 2 provides a simple block diagram depicting various apparatus components arranged for implementing embodiments disclosed herein wherein plasma is utilized to enhance deposition. As shown, a processing zone 318 serves to contain the plasma generated by a capacitively coupled plasma system including a showerhead module 211 working in conjunction with a substrate pedestal module 223, wherein the substrate pedestal module 223 is heated. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the substrate pedestal module 223. The power and frequency supplied by matching network 206 is sufficient to generate a plasma from the process gas/vapor. In an embodiment both the HF generator and the LF generator are used, and in an alternate embodiment, just the HF generator is used. In a typical process, the HF generator is operated at frequencies of about 2-100 MHz; in a preferred embodiment at 13.56 MHz or 27 MHz. The LF generator is operated at about 50 kHz to 2 MHz; in a preferred embodiment at about 350 to 600 kHz. The process parameters may be scaled based on the chamber volume, substrate size, and other factors. Similarly, the flow rates of process gas may depend on the free volume of the vacuum chamber (reaction chamber) or processing zone.

Within the chamber, the substrate pedestal module 223 supports a substrate 13 on which materials such as thin films may be deposited. The substrate pedestal module 223 can include a fork or lift pins to hold and transfer the substrate during and between the deposition and/or plasma treatment reactions. In an embodiment, the substrate 13 may be configured to rest on a surface of the substrate pedestal module 223, however in alternate embodiments the substrate pedestal module 223 may include an electrostatic chuck, a mechanical chuck, or a vacuum chuck for holding the substrate 13 on the surface of the substrate pedestal module 223. The substrate pedestal module 223 can be coupled with a heater block 220 for heating substrate 13 to a desired temperature. Substrate 13 is maintained at a temperature of about 25° C. to 500° C. or greater depending on the material to be deposited.

In certain embodiments, a system controller 228 is employed to control process conditions during deposition, post deposition treatments, and/or other process operations. The controller 228 will typically include one or more memory devices and one or more processors. The processor may include a CPU or computer, analog and/or digital input/output connections, stepper motor controller boards, etc.

In certain embodiments, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, and other parameters of a particular process. Other computer programs stored on memory devices associated with the controller may be employed in some embodiments.

Typically there will be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include substrate timing of the processing steps code, flow rates and temperatures of precursors and inert gases code, and a code for pressure of the chamber.

The showerhead module 211 is preferably temperature controlled and RF powered. An exemplary embodiment of a temperature controlled RF powered showerhead module can be found in commonly-assigned U.S. Patent Application No. 2013/0316094 which is hereby incorporated by reference in its entirety.

Figure 3:
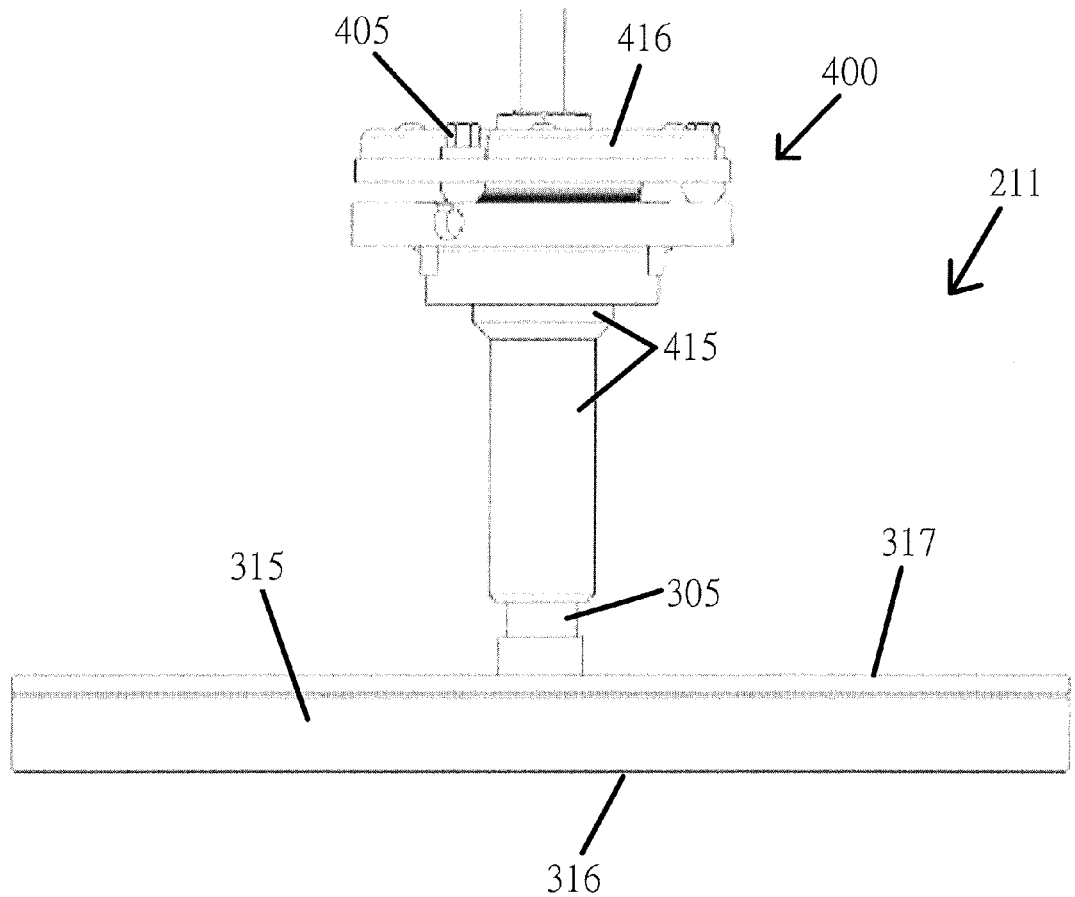
FIG. 3 illustrates a showerhead module arranged in accordance with embodiments disclosed herein.

According to embodiments disclosed herein, the showerhead module preferably includes a ball screw showerhead module adjuster assembly for finely adjusting the planarization of the showerhead module as well providing efficient installation and removal of the showerhead module to and from the semiconductor substrate processing apparatus. As illustrated in FIG. 3, a showerhead module 211 preferably includes a stem 305, a base 315 which includes a backing plate 317 and a faceplate 316 as well as the ball screw showerhead module adjuster assembly 400 for adjusting the planarization of the showerhead module 211. The planarization of the showerhead module 211 can be adjusted by tightening or loosening ball screws 405 which adjust the planarization of a flange 416 of an electrically insulating sleeve 415 which fixedly supports the stem 305 of the showerhead module 211 so that the planarization of the faceplate 316 of the showerhead module 211 may be likewise adjusted.

Figure 4:
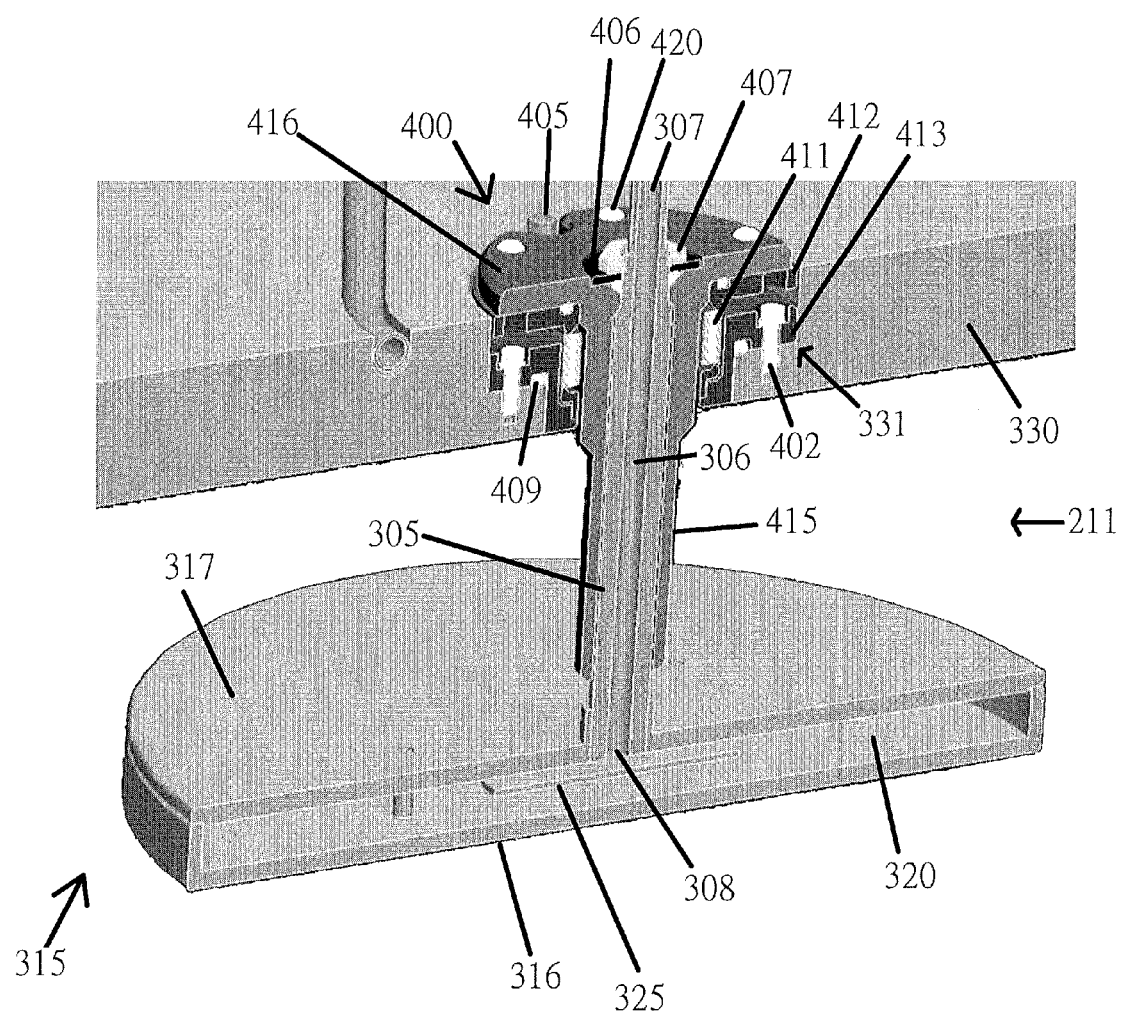
FIG. 4 illustrates a cross section of a showerhead module arranged in accordance with embodiments disclosed herein.

As illustrated in FIG. 4, the showerhead module 211 is preferably supported in a top plate 330 of the chemical isolation chamber (i.e. reaction chamber). The top plate 330 preferably includes a stepped opening 331 which supports a collar 413 therein. A horizontal surface of the stepped opening 331 preferably has openings, such as threaded openings, wherein corresponding stepped openings, for receiving fasteners, in the collar 413 include at least three fasteners 402 which attach the collar 413 to the top plate 330. The collar 413 supports the remainder of ball screw showerhead module adjuster assembly 400 in the top plate 330. The ball screw showerhead module adjuster assembly 400 is grounded by the top plate 330 wherein the insulating sleeve 415 electrically insulates the stem 305 from the top plate 330. The insulating sleeve 415 is preferably formed from ceramic, however any suitable insulating material may be used.

Figure 5:
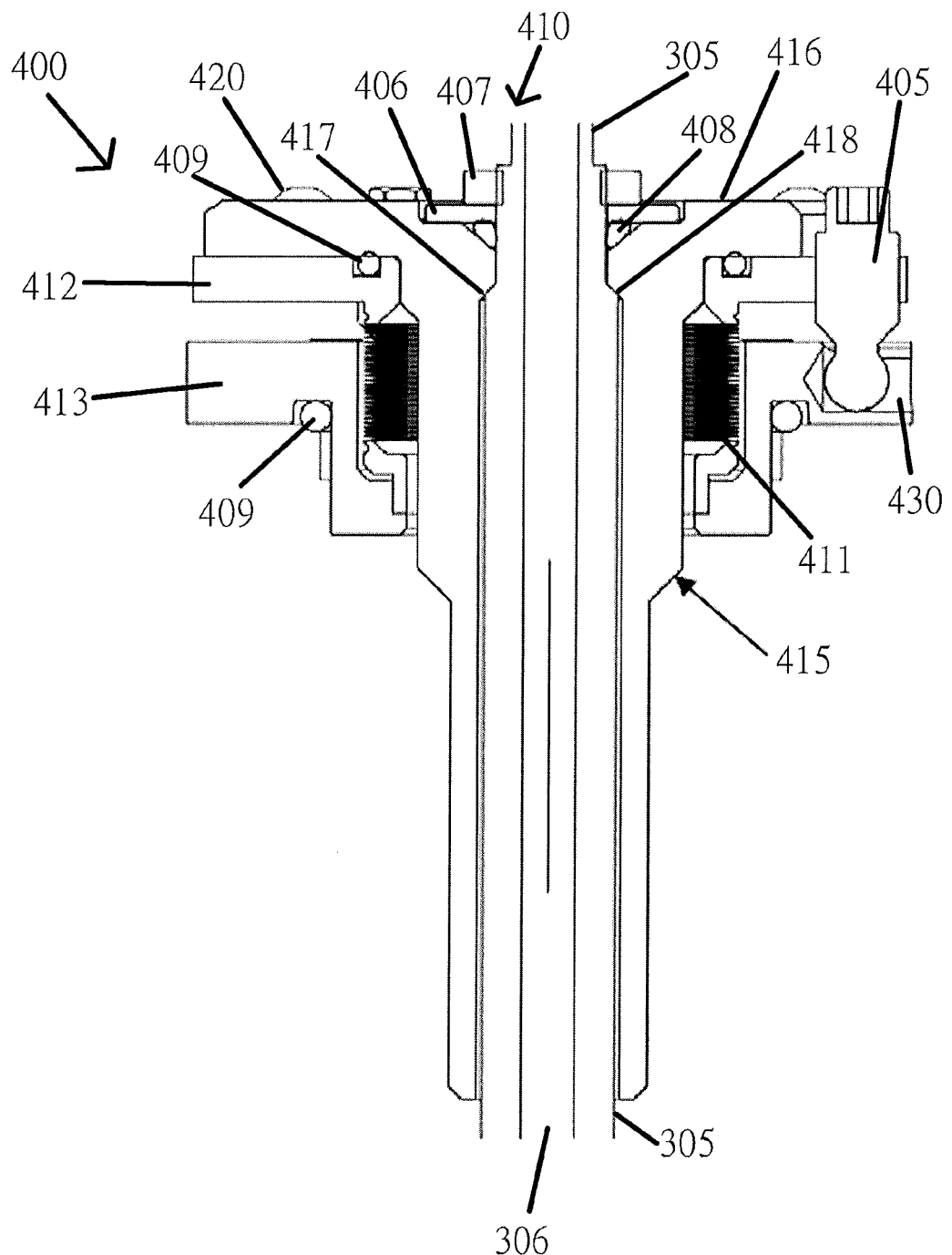
FIG. 5 illustrates a cross section of a ball screw showerhead module adjuster assembly arranged in accordance with embodiments disclosed herein.

Referring now to FIGS. 4 and 5, an O-ring 409 forms an airtight seal (i.e. a hermetic seal) between a lower surface of the collar 413 and the horizontal surface of the stepped opening 331. A bellows 411 forms an airtight seal between the collar 413 and an adjuster plate 412 supported above the collar 413 by at least three adjustable ball screws 405 wherein the at least three adjustable ball screws 405 are operable to adjust the planarization of the adjuster plate 412 with respect to the collar 413. Preferably, an upper end of each ball screw 405 is threadedly supported in a respective recess in a lower surface of the adjuster plate 412 wherein a lower end of each respective ball screw 405 is rotatably received in a ball socket 430 of the collar 413. The insulating sleeve 415 extends through an opening in the collar 413, the bellows 411, and the adjuster plate 412, wherein the flange 416 on an upper end of the insulating sleeve 415 is fixedly supported on an upper surface of the adjuster plate 412 with the O-ring 409 forming a hermetic seal therebetween the flange 416 and the adjuster plate 412. Preferably, the flange 416 of the insulating sleeve 415 and the adjuster plate 412 include corresponding openings wherein at least three fasteners 420 in the corresponding openings fixedly support and attach the flange 416 to the adjuster plate 412.

Figure 6:
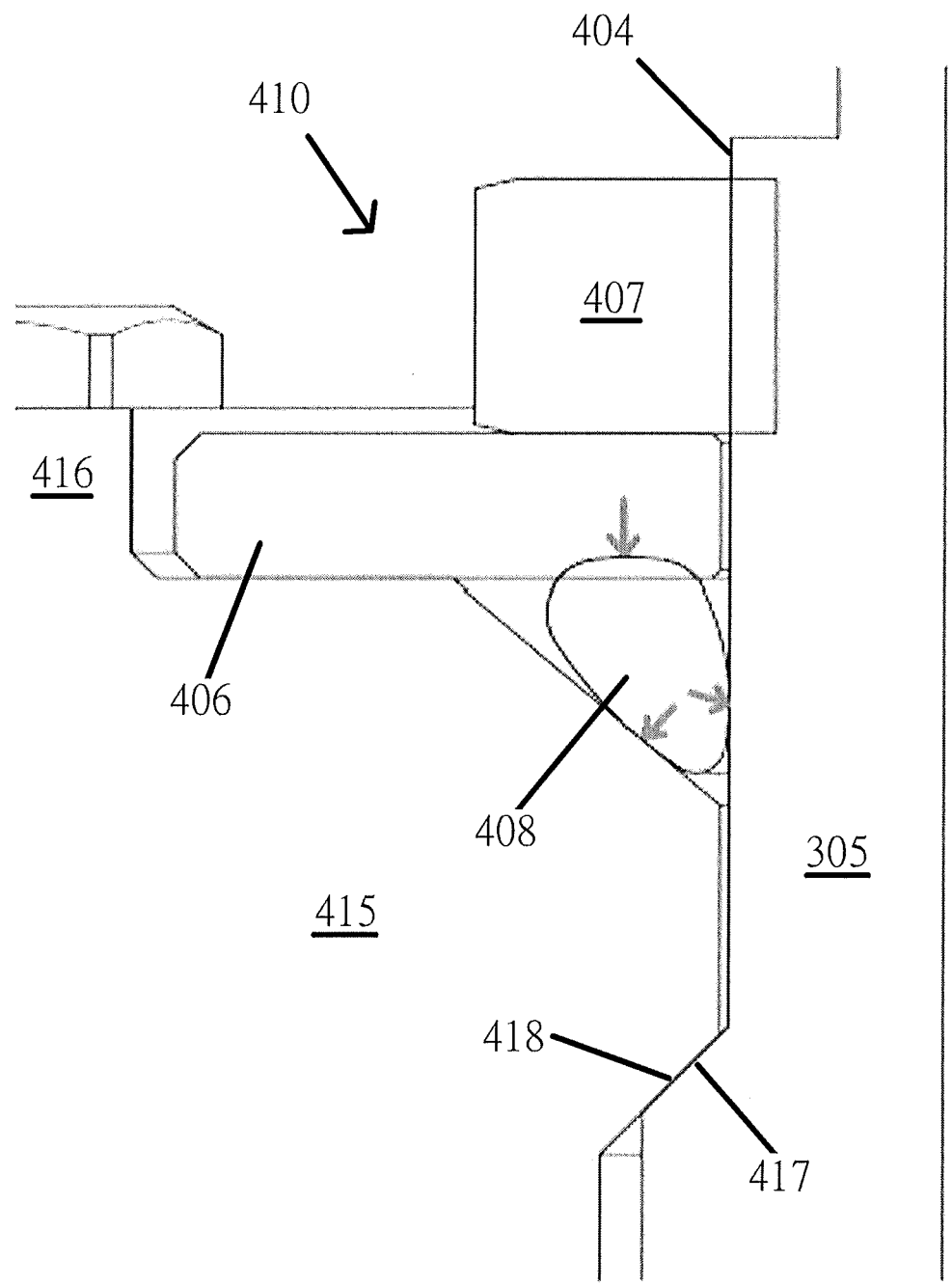
FIG. 6 illustrates a cross section of a nut assembly arranged in accordance with embodiments disclosed herein.

The stem 305 of the showerhead module 211 is supported in a stepped opening of the insulating sleeve 415 by a nut assembly 410. Referring now to FIG. 6 as well as FIGS. 4 and 5, the nut assembly 410 is operable to compress a tapered/conical shoulder 417 of the stem 305 below the nut assembly 410 against a conical shoulder 418 of the insulating sleeve 415 such that the stem 305 of the showerhead module 211 is fixedly supported and aligned within the insulating sleeve 415 so that an adjustment of planarization of the adjuster plate 412 which supports the flange 416 thereby adjusts the planarization of the faceplate 316 of the showerhead module 211. The nut assembly 410 includes a nut 407 which engages with external threads 404 around an upper portion of the stem 305, and a washer 406 below the nut 407 which compresses a seal 408 between the insulating sleeve 415 and the washer 406 so as to form an airtight seal (hermetic seal) between the stem 305 and the insulating sleeve 415 when the nut 407 of the nut assembly 410 is tightened. Thus, the nut assembly 410 allows easy installation and removal of the showerhead module 211 with the tightening and loosening of a single nut 407, which is located outside of the chemical isolation chamber during processing, wherein the seal 408 forms an airtight seal such that the chemical isolation chamber can operate under vacuum pressure.

Preferably lower ends (i.e. the balls) of the respective ball screws 405 fit in the ball sockets 430 of the collar 413. Preferably three ball screws 405 are circumferentially spaced apart with equal or unequal angles therebetween, e.g. two of the angles can be between about 120 and 165 degrees and the third angle can be between about 35 and 120 degrees. Preferably, the ball screws 405 are evenly spaced apart by about 120 degree angles. The ball screws 405 can be tightened or loosened thus varying, in situ, the tilt, pitch, (i.e. planarization) and elevation of faceplate 316 of the showerhead module 211. Preferably adjustment (tightening or loosening) of the ball screws 405 allows an adjustment of planarization of the faceplate 316 to preferably less than about a hundredth of a degree, and more preferably less than about a thousandth of a degree.

The bellows 411 preferably forms an airtight expandable vacuum seal between the collar 413 and the adjuster plate 412 wherein the stem 305 and the insulating sleeve 415 extend through the airtight expandable vacuum seal such that the planarization of the showerhead module 211 can be varied without breaking the airtight expandable vacuum seal. The bellows 411 is preferably welded at an upper end to the adjuster plate 412 and at a lower end to the collar 413.

Preferably, the system controller 228 is electronically connected to at least one in-situ sensor (detector) for measuring the gap height between the faceplate 316 and an upper surface of the substrate pedestal module 223 as well as the planarity of the faceplate 316 with respect to the upper surface of the substrate pedestal module 223, such that gap control and planarization control can be performed in a feedback control mode. Various types of in-situ detectors, such as laser interferometer, inductive, capacitive, acoustic, linear variable differential transformer (LDVT) sensors, can be used as a gap and planarity sensor wherein the sensor can be located either inside or outside of the chemical isolation chamber. Preferably, the sensor is a wireless gapping measurement device such as an auto gapping system (AGS) wafer such as an AGS wafer which is available from CyberOptics Semiconductor of Minneapolis, Minn.

While the semiconductor substrate processing apparatus including the baffle arrangement has been described in detail with reference to specific embodiments thereof, it will be apparent to those skilled in the art that various changes and modifications can be made, and equivalents employed, without departing from the scope of the appended claims.

What is claimed is:

1. A semiconductor substrate processing apparatus for processing semiconductor substrates comprising:
    a chemical isolation chamber in which individual semiconductor substrates are processed wherein a top plate forms an upper wall of the chemical isolation chamber;
    a process gas source in fluid communication with the chemical isolation chamber for supplying a process gas into the chemical isolation chamber;
    a showerhead module which delivers the process gas from the process gas source to a processing zone of the processing apparatus wherein the individual semiconductor substrates are processed wherein the showerhead module comprises a base attached to a lower end of a stem wherein a faceplate having gas passages therethrough forms a lower surface of the base,
    a substrate pedestal module which is configured to support the semiconductor substrate in the processing zone below the faceplate during processing of the substrate; and
    a ball screw showerhead module adjuster assembly which supports the showerhead module in the top plate wherein the ball screw showerhead module adjuster assembly is operable to adjust the planarization of the faceplate of the showerhead module with respect to an upper surface of the substrate pedestal module adjacent the faceplate, the ball screw showerhead module adjuster assembly comprising:
    a collar supported in a stepped opening of the top plate wherein an O-ring forms an airtight seal between a lower surface of the collar and a horizontal upper surface of the stepped opening;
    a bellows which forms an airtight seal between the collar and an adjuster plate supported above the collar by at least three adjustable ball screws wherein the at least three adjustable ball screws are operable to adjust the planarization of the adjuster plate with respect to the collar; and
    an insulating sleeve which extends through an opening in the collar, the bellows, and the adjuster plate, wherein a flange on an upper end of the insulating sleeve is fixedly supported on an upper surface of the adjuster plate and an O-ring forms an airtight seal therebetween;
    wherein the stem of the showerhead module is supported in a stepped opening of the insulating sleeve by a nut assembly, the nut assembly operable to compress a tapered/conical shoulder of the stem below the nut assembly against a conical shoulder of the insulating sleeve such that the stem of the showerhead module is fixedly supported and aligned within the insulating sleeve so that an adjustment of planarization of the adjuster plate thereby adjusts the planarization of the faceplate of the showerhead module.

2. The semiconductor substrate processing apparatus of claim 1, wherein the nut assembly comprises a nut which engages with external threads around an upper portion of the stem, and a washer below the nut which compresses a seal between the insulating sleeve and the washer so as to form an airtight seal between the stem and the insulating sleeve when the nut of the nut assembly is tightened.

3. The semiconductor substrate processing apparatus of claim 1, wherein the adjustable ball screw adjuster is grounded by the top plate wherein the insulating sleeve electrically insulates the stem from the top plate.

4. The semiconductor substrate processing apparatus of claim 1, wherein the collar includes stepped openings and fasteners in the stepped openings attach the collar to the top plate.

5. The semiconductor substrate processing apparatus of claim 1, wherein the flange of the insulating sleeve and the adjuster plate include corresponding openings wherein fasteners in the corresponding openings attach the flange of the insulating sleeve to the adjuster plate.

6. The semiconductor substrate processing apparatus of claim 1, wherein the bellows is welded at an upper end to the adjuster plate and at a lower end to the collar.

7. The semiconductor substrate processing apparatus of claim 1, wherein an upper end of each ball screw is threadedly supported in the adjuster plate and a lower end of each ball screw is rotatably received in a respective ball socket of the collar.

8. A ball screw showerhead module adjuster assembly which is configured to support a showerhead module in a top plate of a semiconductor substrate processing apparatus used for processing semiconductor substrates is operable to adjust the planarization of a faceplate of the showerhead module with respect to an upper surface of a substrate pedestal module configured to be adjacent the faceplate, the ball screw showerhead module adjuster assembly comprising:
a collar configured to be supported in a stepped opening of the top plate wherein an O-ring is configured to form an airtight seal between a lower surface of the collar and a horizontal upper surface of the stepped opening;
a bellows which forms an airtight seal between the collar and an adjuster plate supported above the collar by at least three adjustable ball screws wherein the at least three adjustable ball screws are operable to adjust the planarization of the adjuster plate with respect to the collar; and
an insulating sleeve which extends through an opening in the collar, the bellows, and the adjuster plate, wherein a flange on an upper end of the insulating sleeve is fixedly supported on an upper surface of the adjuster plate and an O-ring forms an airtight seal therebetween;
wherein a stepped opening of the insulating sleeve is configured to receive a stem of the showerhead module which can be attached by a nut assembly configured to compress a tapered/conical shoulder of the stem below the nut assembly against a conical shoulder of the insulating sleeve such that the stem of the showerhead module is fixedly supported and aligned within the insulating sleeve so that an adjustment of planarization of the adjuster plate thereby adjusts the planarization of the faceplate of the showerhead module.

9. The ball screw showerhead module adjuster assembly of claim 8, wherein the collar includes stepped openings configured to receive fasteners which attach the collar to the top plate.

10. The ball screw showerhead module adjuster assembly of claim 8, wherein the flange of the insulating sleeve and the adjuster plate include corresponding openings wherein fasteners in the corresponding openings attach the flange of the insulating sleeve to the adjuster plate.

11. The ball screw showerhead module adjuster assembly of claim 8, wherein an upper end of each ball screw is threadedly supported in the adjuster plate and a lower end of each ball screw is rotatably received in a respective ball socket of the collar.

12. The ball screw showerhead module adjuster assembly of claim 8, wherein the nut assembly comprises a nut which is configured to engage with external threads around an upper portion of the stem, and a washer below the nut which is configured to compress a seal between the insulating sleeve and the washer so as to form an airtight seal between the stem and the insulating sleeve when the nut of the nut assembly is tightened.

13. The ball screw showerhead module adjuster assembly of claim 8, wherein the bellows is welded at an upper end to the adjuster plate and at a lower end to the collar.

14. A showerhead module comprising the ball screw showerhead module adjuster assembly of claim 8, the showerhead module configured to deliver process gas from a process gas source to a processing zone of the semiconductor substrate processing apparatus wherein individual semiconductor substrates are processed wherein the showerhead module comprises a base attached to a lower end of the stem wherein a faceplate having gas passages therethrough forms a lower surface of the base.

15. A method of installing a showerhead module in the semiconductor substrate processing apparatus of claim 1, comprising:
supporting the collar in the stepped opening of the top plate of the processing apparatus wherein the adjuster plate is supported above the collar by the at least three ball screws and a bellows forms an airtight seal between the collar and the adjuster plate;
supporting an insulating sleeve within the collar, bellows, and adjuster plate, wherein a flange of the insulating sleeve is supported on an upper surface of the adjuster plate;
inserting the stem of the showerhead module through the insulating sleeve and tightening a nut of the nut assembly around an external thread of the stem thereby compressing a tapered/conical shoulder surrounding the stem below the external thread against a conical shoulder of the insulating sleeve.

16. The method of claim 15, further comprising adjusting the planarization and gap height of the faceplate with respect to the upper surface of the substrate pedestal module by tightening or loosening at least one ball screw of the adjustable ball screw support.

17. The method of claim 15, further comprising measuring the planarization and gap height of the faceplate with respect to the upper surface of the substrate pedestal module with an in-situ detector selected from the group consisting of a laser interferometer, an inductive sensor, a capacitive sensor, an acoustic sensor, a linear variable differential transformer (LDVT) sensor, and an auto gapping system (AGS) wafer.

18. The method of claim 16, wherein an adjustment of planarization of the faceplate is
(a) to less than about a hundredth of a degree,
(b) to less than about a thousandth of a degree.

19. A method of processing a semiconductor substrate in the semiconductor substrate processing apparatus according to claim 1, comprising:
adjusting the planarization and gap height of the faceplate of the showerhead module with respect to the upper surface of the substrate pedestal module;
supplying the process gas from the process gas source through the showerhead module into the processing zone; and processing a semiconductor substrate in the processing zone.

20. The method of claim 19, wherein the processing is at least one of chemical vapor deposition; plasma-enhanced chemical vapor deposition; atomic layer deposition; plasma-enhanced atomic layer deposition; pulsed deposition layer; molecular layer deposition; etching; resist removal; and/or plasma enhanced pulsed deposition layer.

* * * * *